US006546938B2

(12) United States Patent
Selwyn et al.

(10) Patent No.: US 6,546,938 B2
(45) Date of Patent: Apr. 15, 2003

(54) COMBINED PLASMA/LIQUID CLEANING OF SUBSTRATES

(75) Inventors: Gary S. Selwyn, Los Alamos, NM (US); Ivars Henins, Los Alamos, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 09/803,065

(22) Filed: Mar. 8, 2001

(65) Prior Publication Data

US 2002/0134403 A1 Sep. 26, 2002

(51) Int. Cl.[7] ................................................. B08B 7/06
(52) U.S. Cl. ...................... 134/1.2; 134/1.3; 134/26; 134/30; 134/37; 134/95.2; 134/95.3; 134/902; 156/345.35; 156/345.55
(58) Field of Search ............................. 134/95.2, 55.3, 134/902, 94.1, 95.1, 1.1, 1.2, 1.3, 26, 30, 32, 34, 36, 37; 438/710, 716; 315/111.21; 156/345.35, 345.51, 345.54, 345.55

(56) References Cited

U.S. PATENT DOCUMENTS

| | | | | |
|---|---|---|---|---|
| 5,198,724 A | * | 3/1993 | Koinuma et al. | 156/345.43 |
| 5,369,336 A | * | 11/1994 | Koinuma et al. | 315/111.21 |
| 5,961,772 A | | 10/1999 | Selwyn | 156/345 |
| 6,105,534 A | * | 8/2000 | Siniaguine et al. | 118/723 EB |
| 6,284,668 B1 | * | 9/2001 | Imahashi | 216/38 |

* cited by examiner

Primary Examiner—Alexander Markoff
(74) Attorney, Agent, or Firm—Milton D. Wyrick

(57) ABSTRACT

Apparatus and method for cleaning substrates. A substrate is held and rotated by a chuck and an atmospheric pressure plasma jet places a plasma onto predetermined areas of the substrate. Subsequently liquid rinse is sprayed onto the predetermined areas. In one embodiment, a nozzle sprays a gas onto the predetermined areas to assist in drying the predetermined areas when needed.

24 Claims, 2 Drawing Sheets

COMBINED PLASMA/LIQUID CLEANING OF SUBSTRATES

The present invention generally relates to the cleaning of substrates in the manufacture of electronic circuits, and more specifically to the cleaning of metallic films from substrates. This invention was made with Government support under Contract No. W-7405-ENG-36 awarded by the U.S. Department of Energy. The Government has certain rights in the invention.

BACKGROUND OF THE INVENTION

Modern integrated circuits and computer chips have two levels of fabrication: the "front-end-of-line", (FEOL), which consists of structured portions of silicon and silicon-containing compounds, which are built into the silicon wafers using lithography, thin film deposition, and ion implantation techniques; and the "back-end-of line", (BEOL), components, which wire or connect different regions of a device or different devices, and which are built on top of the wafer surface. Back-end-of-line fabrication typically involves a number of metallization and dielectric isolation films or steps.

In order to make a device operate faster, circuits are commonly "shrunk" in the FEOL fabrication process, as this reduces the electron travel distance, and better conductors are used in the BEOL. This is especially important since smaller lines carrying current also have greater resistance. Traditionally, the BEOL fabrication process has employed aluminum metallurgy in interconnection technology for the reason that aluminum can be easily deposited and etched to make the required wires and contacts needed to connect different devices and different portions of the same device. However, the use of copper in place of aluminum provides an important advantage because copper has a lower resistivity than does aluminum. This lower resistivity of copper allows faster interconnection response due to the resultant lower resistance/capacitance (RC) time constant. Copper is also more resistant to corrosion than aluminum circuitry.

Unfortunately, copper interconnects on a silicon or other semiconductor device presents certain technological problems. As opposed to aluminum, copper cannot be plasma etched because the halide salts of copper are involatile at the relatively low temperatures required for silicon processing. In contrast, aluminum etching is often accomplished by exposing the Al film on a substrate to chlorine-containing plasma, which generates atomic chlorine. The chemical reaction of the plasma-generated atomic chlorine with the Al on the substrate produces the reaction product, $AlCl_3$. This aluminum salt has sufficiently high vapor pressure that it is pumped away by the vacuum system that is always used in low pressure plasma etching. The chlorine-containing feedgas is typically a mix of $BCl_3$ and/or $Cl_2$. To aid in the volatilization and removal of the Al salt, the wafer is heated to 200–300 deg. C., which increases the vapor pressure of the Al salt, resulting in its evaporation from the wafer. These temperatures are acceptable to a wafer and do not cause harm to the materials present on the wafer, nor the structure of the device.

Unlike Al, when exposed to a chlorine or fluorine-containing reactive plasma, copper forms a reaction product, which has a low vapor pressure and thus cannot be pumped away by the vacuum system. This inhibits, and essentially stops, the reaction process because the buildup of the copper fluoride ($CuF_2$) or copper chloride ($CuCl_2$) films form a passivating surface film on the wafer, which prevents reactive chlorine or fluorine atoms from reaching the unreacted copper surface. It would be possible to etch copper in plasmas, by subjecting the wafer to very high temperatures, in the range of 400–700 C. At these temperatures, the copper chloride has sufficient vapor pressure to be pumped away. However, these high temperatures irreversibly damage the devices on the wafer. Because of this, other techniques are required to etch copper. While these techniques are meticulous, and typically involve the use of multiple lift-off steps, in which a layer below the copper film is attacked and then peeled off, no suitable alternative exists at this time. This is because the etching process for the interconnect levels on the wafer needs to achieve high directionality (anisotropy) to produce fine lines.

The present invention relates to another step in copper interconnect technology in which directionality is not required. As part of the developed art in copper process technologies for silicon wafers, it has been shown that it is important to remove unwanted copper film deposits from the beveled edge of a wafer, as well as from the back side edge, and the front edge of the wafer. The copper deposited in these regions is the result of film deposition method used for putting copper films on silicon wafers. Whereas copper is desirable as an interconnect material, the presence of copper on these other portions of the silicon wafer (i.e., the beveled edge of the wafer, the backside of the wafer, and the outermost circumference of the wafer in the so-called "edge exclusion" zone) is considered undesirable because copper in these regions can contaminate the equipment used for processing wafers. Accordingly, it is desirable to remove any copper present in the "edge-exclusion" zone, which typically is 2–4 mm from the periphery of the wafer, and from the other cited regions of the wafer. If not removed from the wafer, copper present in these regions could contaminate the robotic handling system for the tools with which the wafers are processed.

Copper contamination within a process tool could be a cause of yield loss because stray copper can change the electrical properties of the bulk silicon and alter the operation of a device. On the front surface of the wafer, protection of the silicon is achieved by using a barrier layer, usually titanium. However, this protection is missing from the edges of the wafer and from the backside of the wafer. In sum, it is vitally important to remove the copper film from the front edge exclusion zone, the wafer bevel, and the rear edges of the wafer so that serious contamination problems are prevented. Current means of achieving this require exposure of the wafer to acid sprays, because such acids are capable of dissolving copper. This approach works, but is labor intensive, requires additional process steps, and also generates hazardous chemical waste.

The present invention provides a cost-effective alternative to the use of these chemical solvents, which are presently used to remove contaminant copper from the beveled edge, front-side edge exclusion zone and the backside of silicon wafers. It allows edge cleaning of substrates and cleaning of selected portions of the substrate using a plasma and does not require exposure of the substrate to hazardous solvents or acids. It is a unique merging of both dry plasma technology with a gentle liquid rinsing process, something that would be impossible to achieve using conventional, low pressure plasmas, because this plasma process operates at pressures at, or close to atmospheric pressure. It partly accomplishes this through use of the technology described in U.S. Pat. No. 5,961,772, issued Oct. 15, 1999, to Selwyn The teachings of this patent are included herein for all purposes.

It therefore an object of the present invention to provide for isotropic cleaning of copper films from substrates.

It is another object of the present invention to provide for cleaning of copper films from specific regions of a substrate.

It is yet another object of the present invention to provide apparatus that allows copper to be used in integrated circuit fabrication.

It is yet another object of the present invention to provide an approach by which atmospheric pressure plasma processing is alternated with a liquid rinsing step to achieve material process capability that would either not be possible separately, or which would be onerous to achieve using a sequential low-pressure plasma, followed by a rinsing step.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, an in accordance with the purposes of the present invention, as embodied and broadly described herein, the apparatus of this invention for the cleaning of substrates comprises a rotating chuck for holding said substrate for cleaning with a source of flowing atmospheric pressure plasma spaced apart from the substrate for causing the flowing atmospheric pressure plasma to impinge upon predetermined areas of the substrate. A nozzle sprays a liquid rinse onto the predetermined areas of the substrate while the substrate is sequentially or simultaneously exposed to the flowing atmospheric pressure plasma.

In another aspect of the present invention and in accordance with its principles and purposes the apparatus for the cleaning of substrates comprises a rotating chuck for holding the substrate for cleaning with a source of flowing atmospheric pressure plasma spaced apart from the substrate for causing the flowing atmospheric pressure plasma to impinge upon predetermined areas of the substrate. A first nozzle sprays a liquid rinse onto the predetermined areas of the substrate, and a second nozzle blows a gas onto the predetermined areas of the substrate.

In yet another aspect of the present invention and in accordance with its principles and purposes the method for the cleaning of substrates comprises the steps of rotating the substrate to be cleaned on a chuck; impinging a flowing atmospheric pressure plasma onto predetermined areas of the substrate; and spraying a liquid rinse onto the predetermined areas of the substrate.

In yet another aspect of the present invention and in accordance with its principles and purposes the method for the cleaning of substrates comprises the steps of positioning a source of flowing atmospheric pressure plasma to treat predetermined regions of the substrate and rinsing the predetermined regions of the substrate with a liquid rinse for removing a preselected portion of film from the substrate.

In still another aspect of the present invention and in accordance with its principles and purposes apparatus for the cleaning of substrates comprises a chuck for holding the substrate for cleaning in a stationary position, with a source of flowing atmospheric pressure plasma spaced apart from the substrate for causing the flowing atmospheric pressure plasma to impinge upon predetermined areas of the substrate. A means for spraying a liquid rinse impinges onto the predetermined areas of the substrate. Wherein the source of flowing atmospheric pressure plasma and the means for spraying a liquid rinse are rotated so that the flowing atmospheric pressure plasma and the liquid rinse reach predetermined regions of the substrate.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION

The present invention provides for the method and apparatus for the selective localized removal of thin film from the edges, back surfaces, and portions of the front surface of silicon wafers or other substrates. The invention accomplishes this through the utilization of simultaneous, and yet sequential, plasma and liquid rinse spray processing. The invention can be understood most easily through reference to the drawings.

Figure 1:
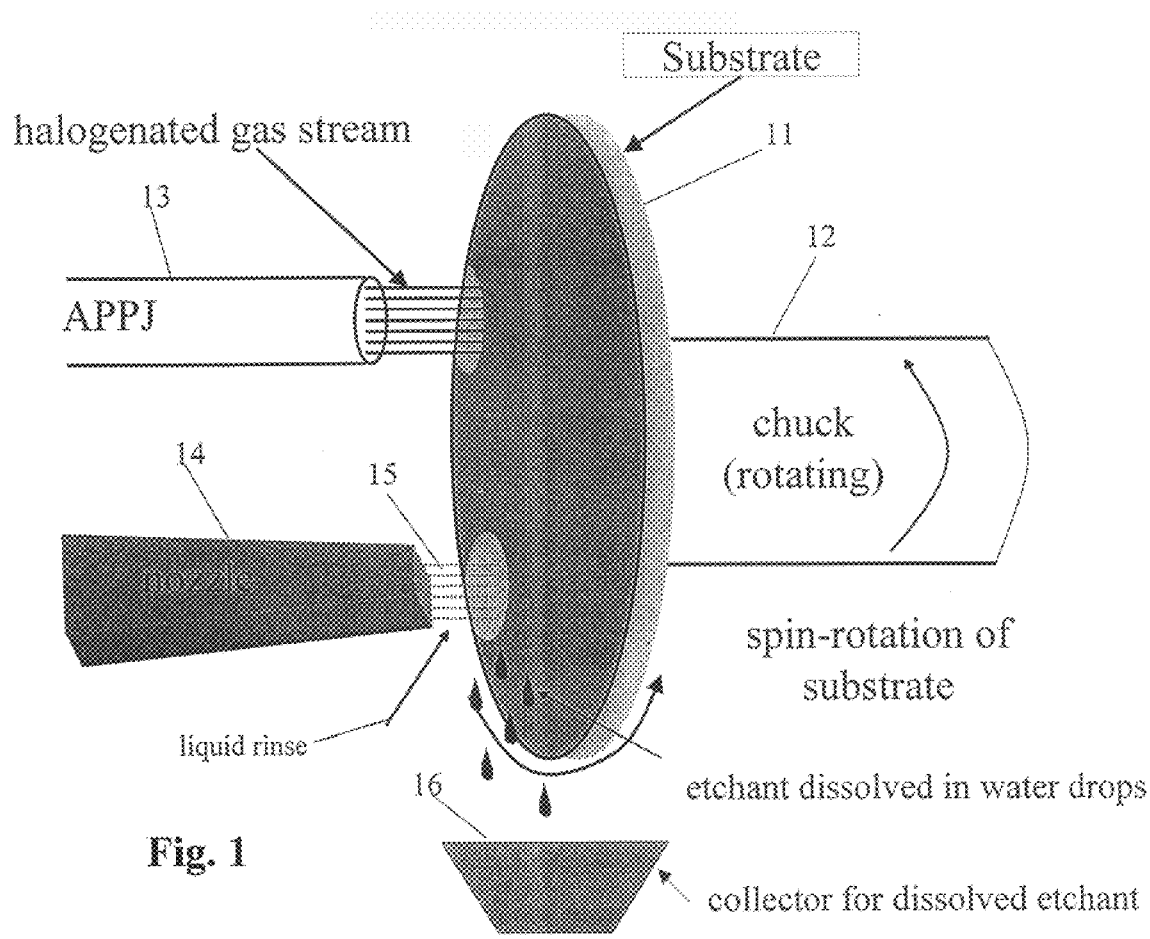
FIG. 1 is a schematical illustration of one embodiment of the present invention showing the plasma jet processing an area of a wafer followed by a rinsing step.

Referring first to FIG. 1, there can be seen a schematical illustration of one embodiment of the present invention. As shown, substrate 11, representing any substrate appropriate for this processing, is held and rotated by rotating chuck 12. At any one instant of time, the output of a source of flowing atmospheric pressure plasma such as Atmospheric Pressure Plasma Jet (APPJ), 13, containing a flow of atomic chlorine formed by the reaction of the electrons in the plasma source with the feedstock, is directed at one portion of substrate 11 and water nozzle 14 sprays liquid rinse 15 at a another portion. With rotating chuck 12 rotating substrate 11 in the direction shown, APPJ 13 processes substrate 11 by converting Copper (Cu), as an example, to Copper Chloride ($CuCl_2$). As substrate 11 rotates, the created $CuCl_2$ is dissolved in liquid rinse 15 sprayed by nozzle 14 and falls into collector 16. This accomplishes the needed removal of the copper film by repeated passage of the wafer region through both the plasma jet gas (containing atomic chlorine) and the spray of liquid rinse 15, which dissolves the copper salt formed by the passage of the wafer through the plasma effluent.

Liquid rinse 15 can be any liquid phase chemical that is effective in dissolving the copper salts or other contaminant to be removed from substrate 11. For many applications, liquid rinse 15 can be water, deionized or distilled. When dealing with cleaning or removal of radioactive or other poorly solvated heavy metal contaminants, such as lead, liquid rinse 15 could contain a chelating agent to enhance the solubility of the plasma-generated salt of the contaminant.

Rotation of substrate 11 performs several important functions. Among these are functions are the following: (1) the rotation allows APPJ 13 to remain stationary with respect to substrate 11, while a desired section of substrate 11 is exposed to the generated plasma; (2) a spray of liquid rinse 15 is directed onto a desired section of substrate 11 after it has been processed by APPJ 13; (3) centrifugal velocity, caused by the rotation of substrate 11, assists in the removal of the dissolved copper as well as the drying of the processed and rinsed section of substrate 11 prior to that section rotating back into the plasma stream from APPJ 13.

The preferred embodiment of the present invention provides a means for removal of copper films from the beveled edge of silicon wafers. To accomplish this, using the above-described plasma/water spray process, the edge of substrate 11 is exposed to a halogen containing plasma effluent from APPJ 13 while rotating on rotating chuck 12, converting the copper film to copper halide. At a slightly later time nozzle 14 sprays liquid rinse 15 toward spinning substrate 11, dissolving the created copper halide.

As referenced above, APPJ 13 is described completely in U.S. Pat. No. 5,961,772. The application of APPJ 13 to the current invention allows the invention to function with a great deal of efficacy and allows removal even of thick copper films through this sequential process approach. Use of conventional, low pressure plasmas to achieve the same would be extremely onerous, as a liquid rinse spray cannot be used in low pressure processing chambers owing to the high vapor pressure of the liquid rinse, which would result in plasma interaction with the liquid rinse vapor. Further, removing the substrate to a separate chamber for rinsing would require multiple passages through vacuum loadlocks, as the liquid rinse spray must be done at atmospheric pressure and the plasma interaction would normally require pressure in the range of 1 to 100 mTorr. Additionally, there would be no easy means of masking the substrate to achieve copper removal from only selected regions. The short reaction distance that the atmospheric pressure plasma jet has, easily achieves such "masking" capability by virtue of the fact that the generated chlorine atoms recombine and become relatively unreactive once they are transported several mm from the source exit. Accordingly, the size of the nozzle on the end of the plasma jet and the distance of the jet from the wafer, as well as the diameter of the plasma source, achieves masking and reaction all in one step.

Figure 2:
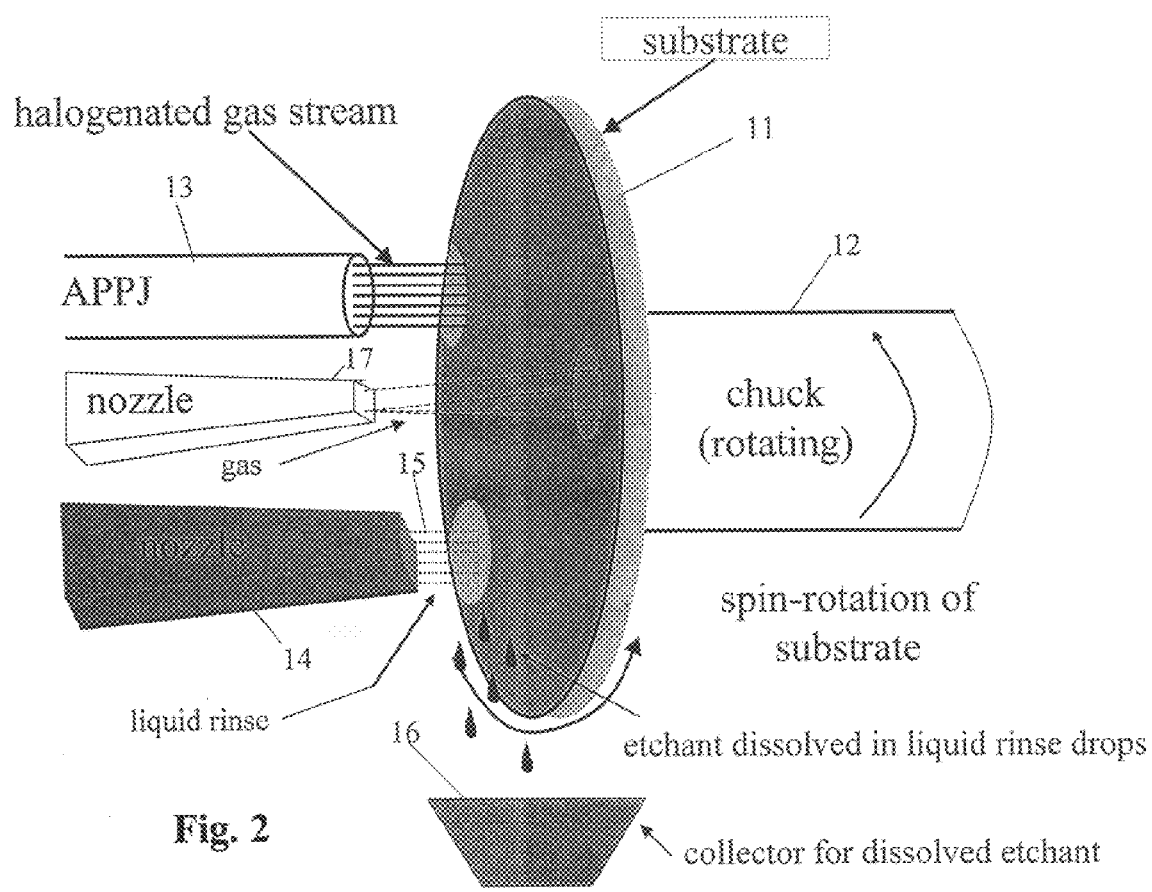
FIG. 2 is a schematical illustration of another embodiment of the present invention in which the rinsing step is followed by a drying step.

Another embodiment of the present invention is shown as a schematical illustration in FIG. 2, and is intended to provide additional drying of desired sections of substrate 11 before the section again encounters APPJ 13. As shown, in addition to APPJ 13 and nozzle 14, gas nozzle 17 is illustrated. In the indicated rotation of substrate 11, gas nozzle would spray nitrogen or other drying gas onto substrate 11 before the treated section again encounters APPJ 13. This is to assist drying of the section of substrate 11 before retreatment, when required. Complete drying of the treated region normally is not required for operation. Simply removing the majority of the sprayed water solution usually is sufficient.

The major advantage of the present invention over prior art wafer cleaning methods is that the regions in which copper removal is required can be selected easily by engineering the flow of gas from APPJ 13 to substrate 11. Also, there is no need for heating of the wafers to high temperatures. The invention is clearly superior to acid-based cleaning processes in both that no masking is required and that no hazardous or toxic waste, other than dissolved $CuCl_2$, is generated. In addition, by aligning APPJ 13 with the edge of substrate 11, this region may be treated locally. Finally, as the present invention is not a batch process, the likelihood of wafer-to-wafer contamination is low. In such batch processes, copper dissolved from the substrate may remain in the tank and may contaminate other substrates unless high volumes of a liquid rinse are used, adding to the generation of liquid, chemical waste.

As previously discussed, the most obvious application of the present invention is for selective removal of copper films from the back surface, edges and other selected regions of the front surface of substrates 11. However, the present invention can be used also to remove any metal or nonmetal film that can be converted into a soluble chemical by exposure to the plasma from APPJ 13, and the soluble chemical then removed by dissolution in deionized water, or other solvent as liquid rinse 15. Other applications may be in the recycling or repair of architectural window glass or computer packaging substrates, and in the flat panel display industry.

It is to be understood that with reference to FIGS. 1 and 2 that substrate 11 could be held stationary and APPJ 13, liquid spray 15 and gas nozzle 17 rotated to achieve the same result. The drawings make it clear that this could be done when such an arrangement is warranted.

The foregoing description of the embodiments of the invention has been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. Apparatus for the cleaning of substrates comprises:
   a chuck for holding said substrate for cleaning;
   an atmospheric pressure plasma jet spaced apart from said chuck and said substrate for causing a plasma to impinge upon predetermined areas of said substrate;
   means for spraying a liquid rinse onto said predetermined areas of said substrate either while or after said substrate is exposed to said plasma while said substrate is held by said chuck.

2. The apparatus as described in claim 1 wherein said substrate comprises a silicon wafer.

3. The apparatus as described in claim 1 wherein said substrate comprises a flat panel display.

4. The apparatus as described in claim 1 wherein said plasma contains halogen feed gas or halogen chemical compounds.

5. The apparatus as described in claim 1 wherein said liquid rinse comprises water.

6. The apparatus as described in claim 1 wherein said liquid rinse comprises a chelating agent.

7. Apparatus for the cleaning of substrates comprises:
   a rotating chuck for holding said substrate for cleaning;
   an atmospheric pressure plasma jet spaced apart form said rotating chuck and said substrate for causing a plasma to impinge upon predetermined areas of said substrate;
   means for spraying a liquid rinse onto said predetermined areas of said substrate while said substrate is held by said rotating chuck; and
   a nozzle for blowing a gas onto said predetermined areas of said substrate while said substrate is held by said rotating chuck.

8. The apparatus described in claim 7 wherein said gas is nitrogen.

9. The apparatus described in claim 7 wherein said substrate comprises a silicon wafer.

10. The apparatus described in claim 7 wherein said substrate comprises a flat panel display.

11. The apparatus described in claim 7 wherein said plasma contains a halogen gas or a halogen compound.

12. The apparatus described in claim 7 wherein said liquid rinse comprises water.

13. The apparatus described in claim 7 wherein said liquid rinse comprises a chelating agent.

14. A method of cleaning substrates comprises the steps of:

rotating said substrate to be cleaned on a chuck;

impinging a plasma from a source of flowing atmospheric pressure plasma onto predetermined areas of said substrate while said substrate is on said chuck;

spraying a liquid rinse onto said predetermined areas of said substrate while said substrate is on said chuck.

15. The method described in claim 14 wherein said substrate is a silicon wafer.

16. The method described in claim 14 wherein said substrate is a flat panel display.

17. The method as described in claim 14 wherein said liquid rinse comprises water.

18. The method as described in claim 14 wherein said liquid rinse comprises a chelating agent.

19. The method described in claim 14 further comprising the step of blowing a gas onto said predetermined areas of said substrate for drying said predetermined areas of said substrate.

20. The method described in claim 19 wherein said gas comprises nitrogen.

21. The method as described in claim 14 wherein said plasma contains a halogen gas or a halogen compound.

22. A method for cleaning of substrates held by a chuck comprises the steps of:

positioning an atmospheric pressure plasma jet in a position to treat predetermined regions of said substrate while said substrate is held by said chuck;

treating said predetermined regions of said substrate with said plasma while said substrate is held by said chuck;

rinsing said predetermined regions of said substrate with a liquid rinse for removing a preselected portion of film from said substrate while said substrate is held by said chuck.

23. Apparatus for the cleaning of substrates comprises:

a chuck for holding said substrate for cleaning in a stationary position;

an atmospheric pressure plasma jet spaced apart from said substrate and said chuck for causing a plasma to impinge upon predetermined areas of said substrate;

means for spraying a liquid rinse onto said predetermined areas of said substrate while said substrate is held by said chuck; and wherein said atmospheric pressure plasma jet and said means for spraying a liquid rinse are rotated so that said plasma and liquid rinse reach predetermined regions of said substrate while said substrate is held by said chuck.

24. The apparatus as described in claim 23, further comprising a nozzle for blowing a gas onto said predetermined areas of said substrate rotating with said atmospheric pressure plasma jet and said spray of a liquid rinse.

* * * * *